United States Patent [19]

Hong

[11] Patent Number: 5,445,983
[45] Date of Patent: Aug. 29, 1995

[54] METHOD OF MANUFACTURING EEPROM MEMORY DEVICE WITH A SELECT GATE

[75] Inventor: Gary Hong, Hsin-Chu, Taiwan

[73] Assignee: United Microelectronics Corporation, Hsinchu, Taiwan

[21] Appl. No.: 320,896

[22] Filed: Oct. 11, 1994

[51] Int. Cl.⁶ .......................................... H01L 21/8247
[52] U.S. Cl. .......................... 437/43; 437/44; 437/984
[58] Field of Search ............ 437/43, 44, 158, 984, 437/985; 148/DIG. 116

[56] References Cited

U.S. PATENT DOCUMENTS

| | | | |
|---|---|---|---|
| 5,049,516 | 9/1991 | Arima | 437/43 |
| 5,081,054 | 1/1992 | Wu et al. | 437/43 |
| 5,100,818 | 3/1992 | Arima et al. | 437/43 |
| 5,364,806 | 11/1994 | Ma et al. | 437/43 |

OTHER PUBLICATIONS

Ajika et al., "A Novel Cell Structure for 4 MBit Full Feature EEPROM and Beyond" IEEE IEDM pp. 295–298 (1991).

*Primary Examiner*—Chandra Chaudhari
*Attorney, Agent, or Firm*—George O. Saile; Graham S. Jones, II

[57] ABSTRACT

A method is provided for fabricating an MOSFET device on a lightly doped semiconductor substrate. A first dielectric layer on the substrate is patterned with a select gate channel opening therein. Sacrificial spacer structures are formed adjacent to the edges of the channel opening in the first dielectric layer. A gate oxide layer is formed at the base of the opening, followed by a select gate for a select transistor over the gate oxide layer between the spacer structures in the channel opening. The sacrificial spacer structures are removed exposing the substrate to form trenches between the first dielectric layer and the select gate. A pair of select transistor doped source/drain regions in the substrate are formed to define the select transistor channel using the select gate and the first dielectric layer as a self-aligned mask. Removal of the first dielectric layer exposes the substrate surrounding the select gate, followed by forming a thin silicon dioxide layer over the select gate and the substrate, and a floating gate conductor over the select gate and a portion thereof in contact with one of the thin silicon dioxide layers, an interconductor dielectric layer over the floating gate conductor, a control gate structure over the interconductor dielectric layer, and ion implanting a pair of stacked gate doped source/drain regions in the substrate.

20 Claims, 8 Drawing Sheets

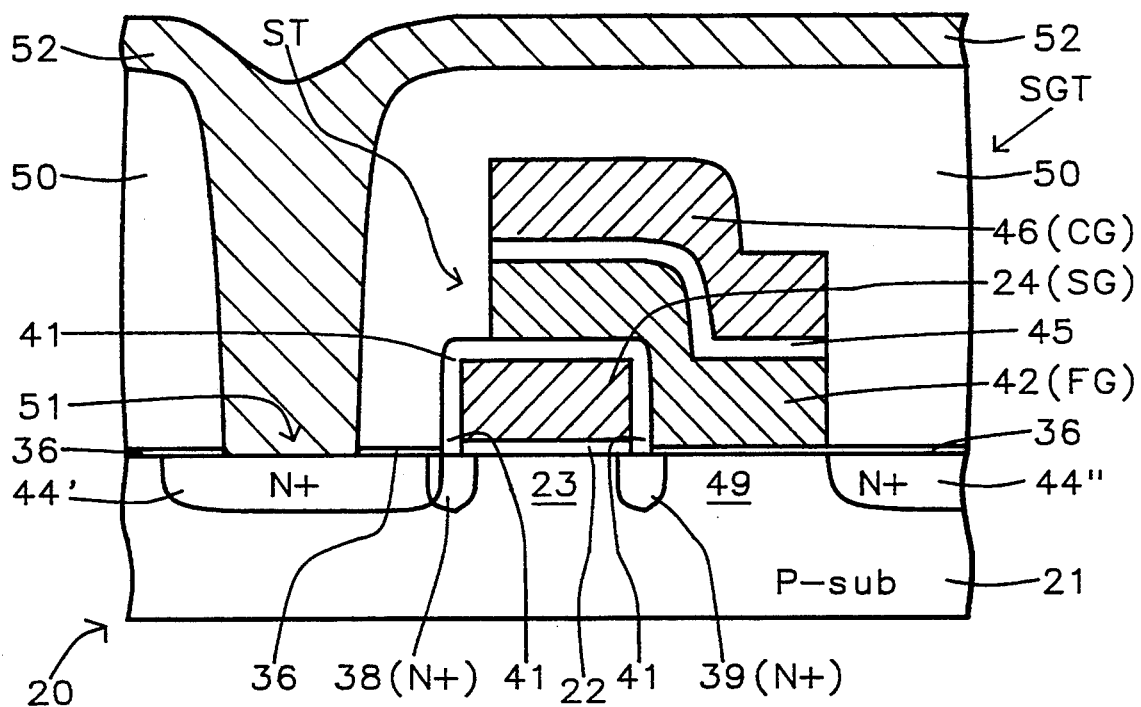
FIG. 1A
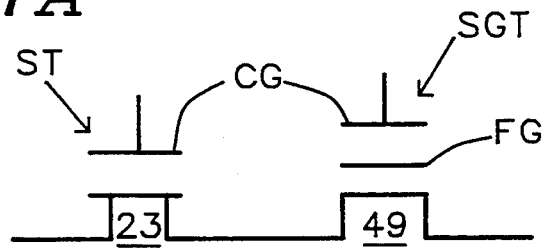
FIG. 1B
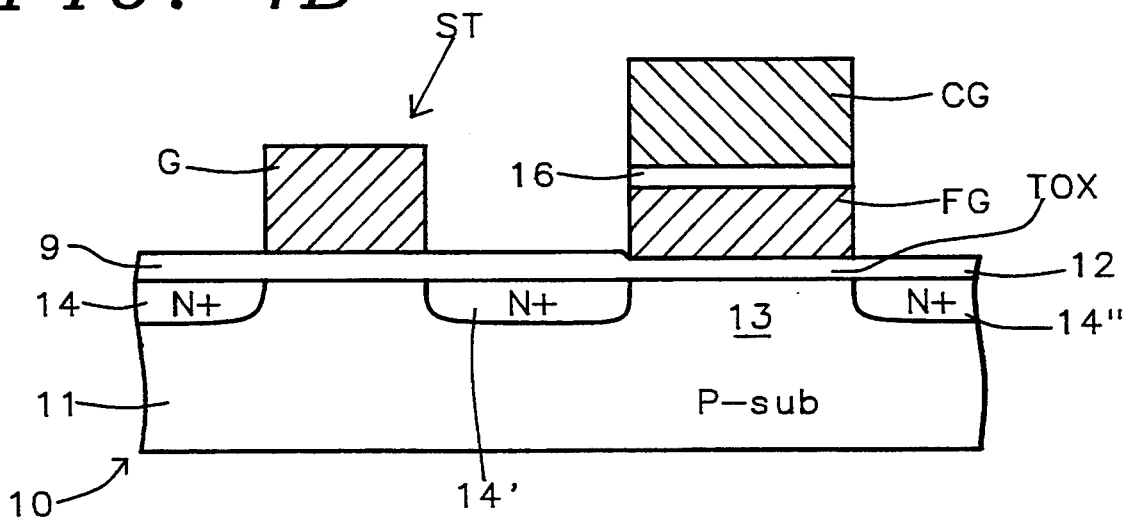
FIG. 2 - Prior Art

METHOD OF MANUFACTURING EEPROM MEMORY DEVICE WITH A SELECT GATE

BACKGROUND OF THE INVENTION

1. Field of the Invention

This invention relates to semiconductor memories and particularly to EEPROM cells and their manufacture.

2. Description of Related Art

FIG. 2 shows a conventional prior art EEPROM cell 10 with a P-substrate 11 covered in different regions with gate oxide layer 9 (150 Å ~ 300 Å thick) and tunnel oxide (TOX) layer 12 (80 Å ~ 100 Å thick). On the left side of the device is a select transistor ST including gate G above gate oxide layer 9 and select transistor N+ S/D regions 14, 14' formed in P- substrate 11. The select transistor ST usually needs to handle (pass) higher voltages to provide program or erase operations. Therefore, the gate oxide layer 9 for the select transistor ST is usually thicker. The N+ S/D regions 14, 14' are aligned with the periphery of gate G. Adjacent to the select transistor ST, on the right formed above the tunnel oxide (TOX) layer 12 is a stack of layers comprising floating gate FG formed on the tunnel oxide layer, interpolysilicon dielectric layer 16 overlying the floating gate layer FG and the control gate CG which overlies the interpolysilicon dielectric layer 16. The lower left edge of floating gate FG overlies the right end of N+ region 14' in the substrate 11. The lower right edge of floating gate FG overlies the left end of N+ region 14'' in substrate 11.

EEPROM Electrically Erasable Programmable Read Only Memory devices have included a triple electrode variety with a select gate on the bottom, a floating gate in the middle and a control gate on top. Ajika et al "A Novel Cell Structure for 4M Bit Full Feature EEPROM and Beyond", IEEE IEDM pp 295-298 [reprint pp. 11.1.1-11.1.4] (1991) shows an EEPROM cell with a complicated three level resist and resist etch back process used to create a narrow tunnel oxide region. Ajika et al describes a configuration with the first polysilicon layer used as the select gate. The tunnel N+ region is merged with the source region of the select gate transistor. The tunnel N+ region is self-aligned to form a small N+ region, which is very small resulting in cell size reduction. In addition, the stacking of the floating gate/control gate (polysilicon 2/polysilicon 3) layers layers over a select gate (polysilicon 1) layer is shown. The Ajika et al design permits reduction of cell size because of the configuration described there.

The second and third layers of polysilicon form the floating gate and the control gate, which are stacked on the select gate. An important problem with the design of Ajika et al is that the EEPROM cell is fabricated with a complicated three level resist and resist etch back process used to create a narrow tunnel oxide region.

SUMMARY OF THE INVENTION

In accordance with another aspect of this invention, a method is provided for fabricating an MOSFET device on a lightly doped semiconductor substrate comprises, forming a first dielectric layer on said substrate, patterning said first dielectric layer with a select gate channel opening therein, forming sacrificial spacer structures adjacent to the edges of said channel opening in said first dielectric layer, forming a gate oxide layer at the base of said opening, forming a select gate for a select transistor over said gate oxide layer between said spacer structures in said channel opening, removing said sacrificial spacer structures exposing the surface of said substrate thereby forming trenches between said first dielectric layer and said select gate, ion implanting a pair of select transistor doped source/drain regions in said substrate to define said select transistor channel using said select gate and said first dielectric layer as a self-aligned mask, removing said first dielectric layer exposing the surface of said substrate surrounding said select gate, forming blanket thin silicon dioxide layers over said select gate and said substrate, forming a floating gate conductor over said select gate and a portion thereof in contact with one of said thin silicon dioxide layers, forming an interconductor dielectric layer over said floating gate conductor, forming a control gate structure over said interconductor dielectric layer, and ion implanting a pair of stacked gate doped source/drain regions in said substrate.

Preferably, the first dielectric layer comprises silicon dioxide having a thickness within a range between about 1,000 Å and about 4,000 Å. The interconductor dielectric layer comprises ONO. The select gate, floating gate and control gate layers comprise polysilicon. The sacrificial spacer structures are formed from a silicon nitride layer having a thickness of about 1000 Å which was shaped into spacers by an etch back process.

The gate oxide has a thickness of about 200 Å.

The blanket thin silicon dioxide layers over the select gate and the substrate comprise polysilicon oxide and tunnel oxide.

The thin dielectric layer comprises silicon dioxide.

The select gate source/drain implant employs implantation of arsenic ions at between about 30 keV and about 100 keV at between about $1 \text{ E } 13 \text{ cm}^{-2}$ and about $1 \text{ E } 15 \text{ cm}^{-2}$.

The stacked gate doped source/drain implant employs implantation of arsenic ions at between about 30 keV and about 80 keV at between about $1 \text{ E } 15 \text{ cm}^{-2}$ and about $5 \text{ E } 15 \text{ cm}^{-2}$.

In accordance with another aspect of this invention, a method of fabricating an MOSFET device on a lightly doped semiconductor substrate comprises, forming a sacrificial silicon dioxide layer on the substrate, patterning the sacrificial silicon dioxide layer with a mask with a select gate channel opening therein and then etching the sacrificial silicon dioxide layer through the openings in the mask to form a select gate channel opening in the sacrificial silicon dioxide layer, forming sacrificial spacer structures adjacent to the edges of the channel opening in the sacrificial silicon dioxide layer, forming a gate oxide layer at the base of the channel opening, forming a select gate for a select transistor over the gate oxide layer between the spacer structures in the channel opening, removing the sacrificial spacer structures exposing the surface of the substrate thereby forming trenches between the sacrificial silicon dioxide layer and the select gate, ion implanting a pair of select transistor doped source/drain regions defining the channel in the substrate using the select gate and the sacrificial silicon dioxide layer as a self-aligned mask, removing the sacrificial silicon dioxide layer exposing the surface of the substrate surrounding the select gate, forming blanket thin silicon dioxide layers over the select gate and the substrate, forming a floating gate conductor over the select gate and a portion thereof in contact with one of the thin silicon dioxide layers, forming an interconductor dielectric layer over the floating gate conductor, forming a control gate structure over the interconductor dielectric layer, and ion implanting a pair of stacked gate doped source/drain regions in the substrate.

Preferably, the sacrificial silicon dioxide layer has a thickness within a range between about 1,000 Å and about 4,000 Å.

The interconductor dielectric layer comprises ONO.

The select gate, floating gate and control gate layers comprise polysilicon.

The sacrificial spacer structures are formed from a silicon nitride layer having a thickness of about 1000 Å which was shaped into spacers by an etch back process.

The gate oxide has a thickness of about 200 Å.

The blanket thin silicon dioxide layers over the select gate and the substrate comprise polysilicon oxide and tunnel oxide.

The thin dielectric layer comprises silicon dioxide.

The select gate source/drain implant employs implantation of arsenic ions at between about 30 keV and about 100 keV at between about $1 \, E \, 13 \, cm^{-2}$ and about $1 \, E \, 15 \, cm^{-2}$.

The stacked gate doped source/drain implant employs implantation of arsenic ions at between about 30 keV and about 80 keV at between about $1 \, E \, 15 \, cm^{-2}$ and about $5 \, E \, 15 \, cm^{-2}$.

In accordance with still another aspect of this invention, a MOSFET device on a lightly doped semiconductor substrate comprising, a gate oxide layer formed on the substrate below a select gate, a select gate transistor including a pair of ion implanted select transistor doped source/drain regions, the select transistor source/drain regions defining a select transistor channel in the substrate aligned with the select gate, blanket thin silicon dioxide layers over the select gate and the substrate, a floating gate conductor over the select gate and a portion thereof in contact with one of the thin silicon dioxide layers, an interconductor dielectric layer over the floating gate conductor, and a control gate structure over the interconductor dielectric layer.

Preferably, the interconductor dielectric layer comprises ONO.

The select gate, floating gate and control gate layers comprise polysilicon.

The gate oxide has a thickness of about 200 Å.

The blanket thin silicon dioxide layers over the select gate and the substrate comprise polysilicon oxide and tunnel oxide.

The thin dielectric layer comprises silicon dioxide.

The select gate source/drain implant employs implantation of arsenic ions at between about 30 keV and about 100 keV at between about $1 \, E \, 13 \, cm^{-2}$ and about $1 \, E \, 15 \, cm^{-2}$.

The stacked gate doped source/drain implant employs implantation of arsenic ions at between about 30 keV and about 80 keV at between about $1 \, E \, 15 \, cm^{-2}$ and about $5 \, E \, 15 \, cm^{-2}$.

BRIEF DESCRIPTION OF THE DRAWINGS

The foregoing and other aspects and advantages of this invention are explained and described below with reference to the accompanying drawings, in which:

FIG. 1A is a cross sectional view of an EEPROM memory device in accordance with this invention.

FIG. 1B shows an electrical schematic diagram of the device of FIG. 1A.

FIG. 2 shows a conventional prior art EEPROM cell.

DESCRIPTION OF THE PREFERRED EMBODIMENT

Figure 3A:
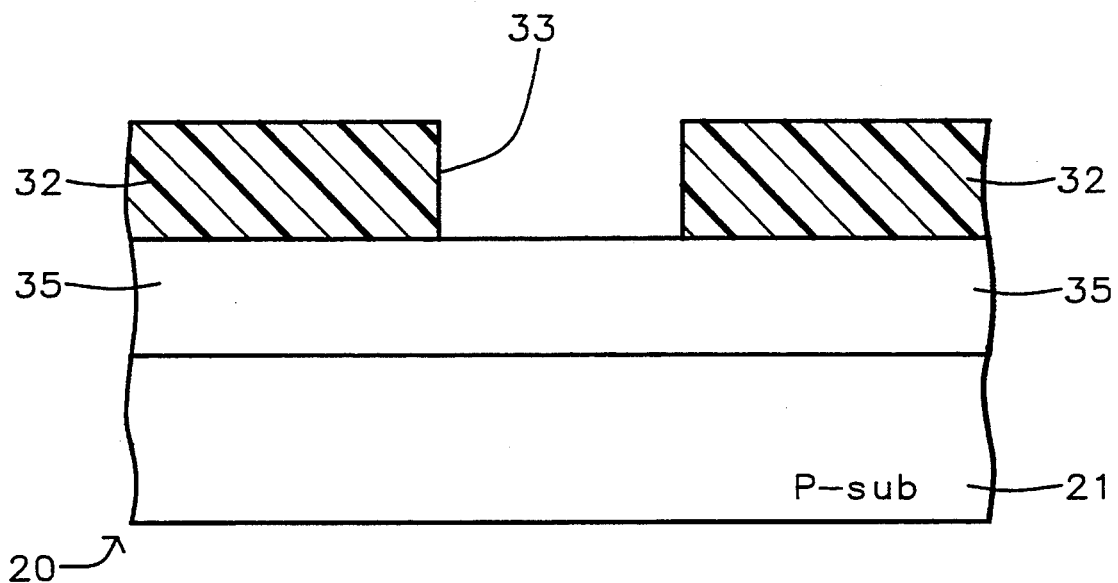
FIGS. 3A-3N illustrate a process for making the device of FIG. 1A.

This invention provides a structure and a process sequence for producing an EEPROM memory device which is described below with reference to FIG. 1A which shows the structure of the device. FIG. 1B shows an electrical schematic diagram for the device of FIG. 1A. FIGS. 3A-3N illustrate a process for making the device of FIG. 1A.

Referring to FIG. 1A, EEPROM memory device 20 is formed on a silicon substrate 21. In contact with the surface of the substrate 21 are tunnel oxide regions 36, gate oxide region 22 and the regions of polysilicon oxide (POX) layer 41 at the lateral extremities of gate oxide region 22 as seen in FIG. 1A. In the surface of substrate 21 located below the ends of polysilicon oxide 41 are a pair of small select gate source/drain N+ doped regions 38 and 39 which define the ends of the select gate channel region 23. To the left of select gate channel region 23 and its leftmost N+ implant region 38 is formed an N+ drain region 44' for the EEPROM portion of device 20 including select gate 24, floating gate 42 and control gate 46. To the right of the N+ implant region 39 is floating gate channel region 49. Across floating gate channel region 49 from implant region 39 and spaced substantially to the right therefrom across floating gate channel region 49 from region 39 is N+ source region 44". Above the select gate channel region 23 is the gate oxide layer 22, upon which is formed a polysilicon 1 select gate 24. Surrounding the exposed surfaces of the select gate 24 (above gate oxide 22) is a polysilicon oxide layer 41 which reaches down into contact with regions 38 and 39, as explained above. As stated previously, above the remainder of the substrate 21 is the tunnel oxide layer 36. Overlying a portion of the gate oxide layer 22 and over most of select gate 24 is a stack of three layers of a (polysilicon 2) floating gate 42, interpolysilicon dielectric 45 and (polysilicon 3) control gate 46. Floating gate (polysilicon 2) 42 extends down into contact with the tunnel oxide layer 36 above the channel 49, on the right. Over the structure, described above, a BPSG glass layer 50 has been formed using a conventional process. Glass layer 50 is then heated to flow in a conventional manner. A bit line contact opening 51 was formed through BPSG layer 50 extending through the tunnel oxide layer 36 to N+ region 44'. Bit line metallization 52 extends across the upper surface of the device 20 above the BPSG layer 50, and the bit line metallization 52 reaches down though contact opening 51 into contact with N+ drain region 44'.

FIG. 1B shows an equivalent circuit of the device of FIG. 1A. The circuit includes a conventional select transistor ST with a control gate CG and a stacked-gate transistor SGT. Stacked-gate transistor SGT includes the channel 49 (FIG. 1A), floating gate FG and control gate CG. Select transistor ST includes the channel 23 (FIG. 1A) and control gate CG among other conventional elements.

Actually, this type of EEPROM cell of FIGS. 1A and 1B can be used in a conventional full-feature EEPROM application or in a flash-EEPROM application.

The select transistor ST in this type of EEPROM structure is to either "pass" or "isolate" (so it is called a "select" transistor) the appropriate voltage (for program/erase and read operations) to the stacked-gate.

PROCESS

FIGS. 3A–3N show the process flow in accordance with this invention, providing a sequence of cross-sectional illustrations (taken along the same section line) of the process of manufacture of the device 20 of FIG. 1A.

Front End Process

Referring to FIG. 3A, the device 20 is shown in the early stages of fabrication in accordance with the method of this invention, with a P- doped silicon substrate 21 which has been produced by a conventional doping process, etc.

Silicon Dioxide Formation

Next the conventional process of gate oxidation the substrate 21 is covered with a blanket of a first dielectric (silicon dioxide) layer 35 deposited by a conventional process of CVD (chemical vapor deposition). The thickness of first dielectric (silicon dioxide) layer 35 ranges between about 1,000 Å and about 4,000 Å.

Select Gate Channel Patterning

Then, referring again to FIG. 3A, a photoresist mask 32 is formed over first dielectric (silicon dioxide) layer 35 incorporating a select gate channel pattern with an opening 33 for the select gate 24 to be formed (as described below with reference to FIGS. 3F and 3G) and formation of the select transistor S/D regions, which define the select gate channel region 23 below the select gate 24 in FIG. 1A.

Etching of Select Gate Opening

Figure 3B:
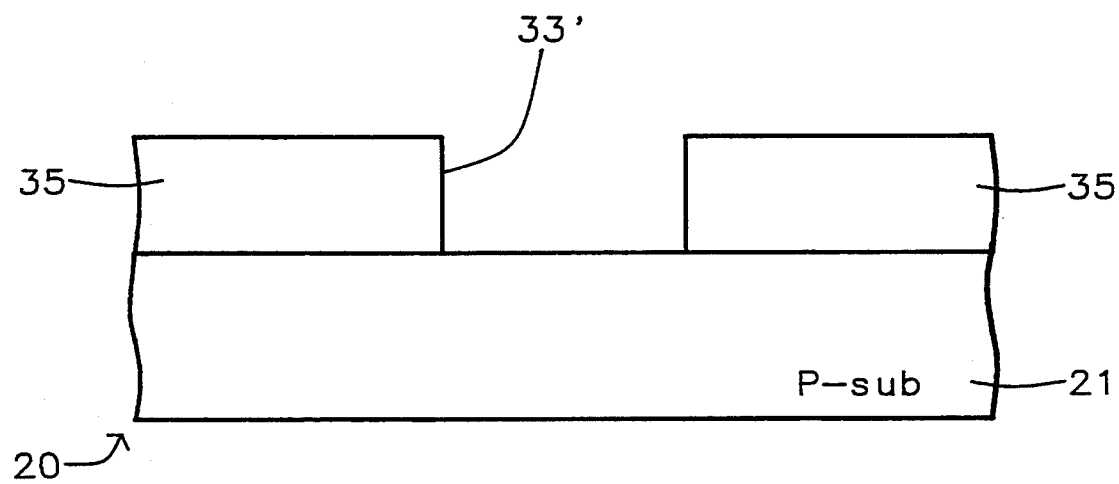

FIG. 3B shows the product of FIG. 3A after the opening 33' in first dielectric (silicon dioxide) layer 35 has been etched through opening 33 in mask 32. Thus, select gate channel opening 33' has been opened down to P-substrate 21. The method of etching comprises dry etching.

Next, the mask 32 is stripped from device 20 leaving the surface of layer 35 and the opening 33' in the surface of substrate 21.

Blanket Deposition of Sacrificial Silicon Nitride Layer

Figure 3C:
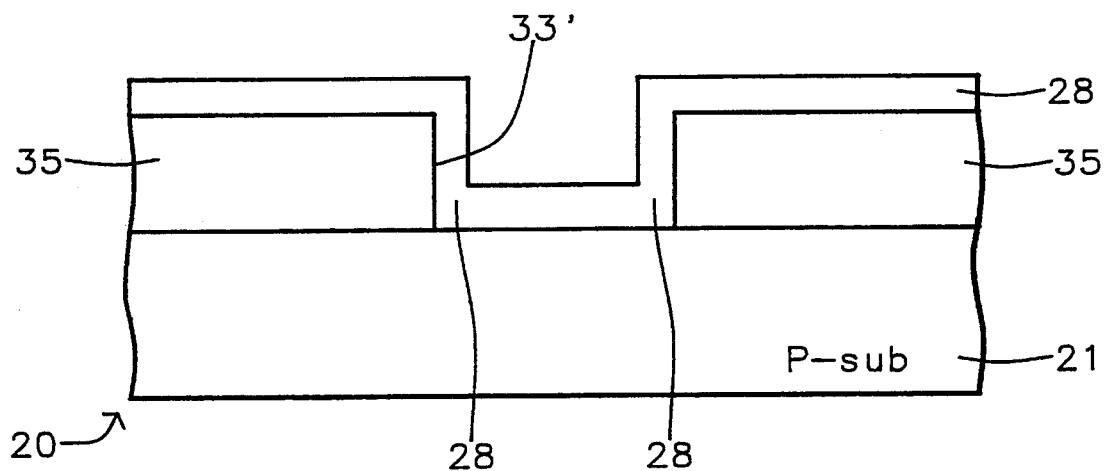

Referring to FIG. 3C, the device of FIG. 3B is shown after stripping of mask 32 and after blanket deposition of silicon nitride ($Si_3N_4$) layer 28 by an LPCVD or a PECVD method. The thickness of $Si_3N_4$ layer 28 is preferably about 1000 Å thick and with a range of thicknesses between about 500 Å and about 2,000 Å.

Formation of Sacrificial Silicon Nitride Spacers

Etch Back

Figure 3D:
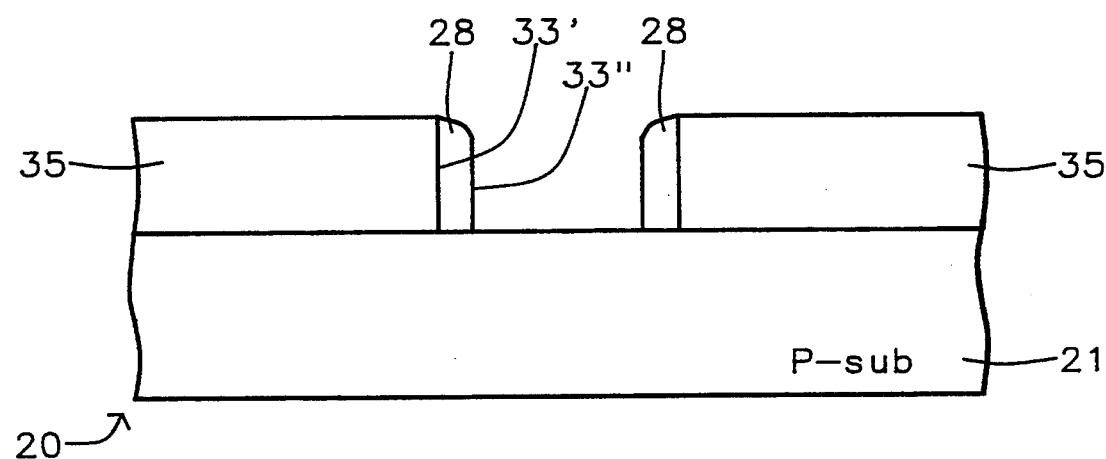

Referring to FIG. 3D, the device of FIG. 3C is shown after the spacer layer 28 has been etched to form sacrificial spacers 28 having a dimension of between about 0.05 μm and 0.2 μm width which cover the sidewalls of layer 35 in opening 33' providing a narrower opening 33" therein. The etch back process for forming spacers 28 from spacer layer 28 comprises a conventional anisotropic plasma etch.

Formation of Gate Oxide Layer

Figure 3E:
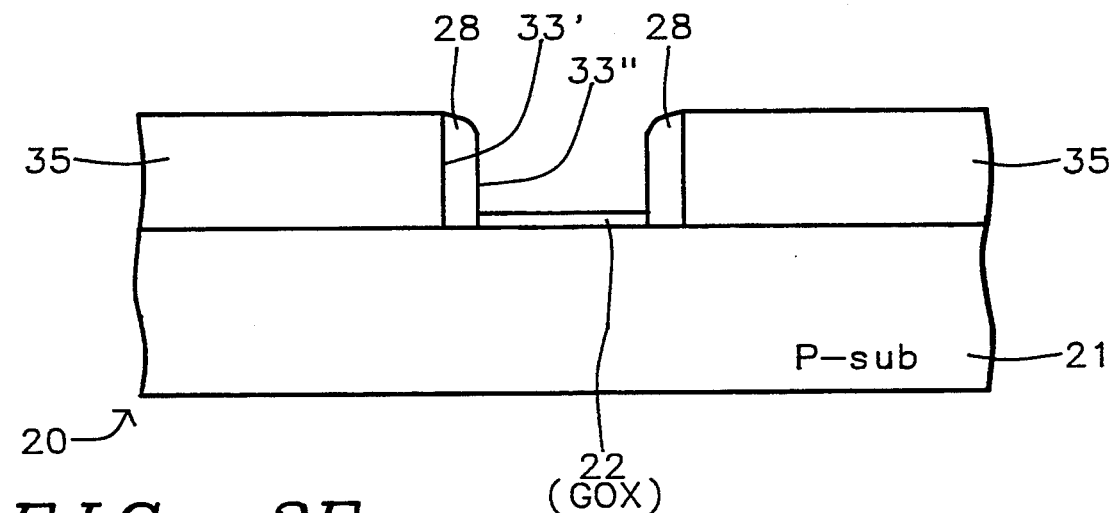

Referring to FIG. 3E, the device of FIG. 3D is shown after formation of silicon dioxide gate oxide (GOX) layer 22 at the base of opening 33" on the exposed surface of substrate 21 at the base of opening 33", located between sacrificial silicon nitride spacers 28. The gate oxide layer 22 which has a thickness preferably of about 200 Å, is preferably formed by an oxidation by process in a furnace at 800°–950° C.

Polysilicon 1 Deposition and Doping

Figure 3F:
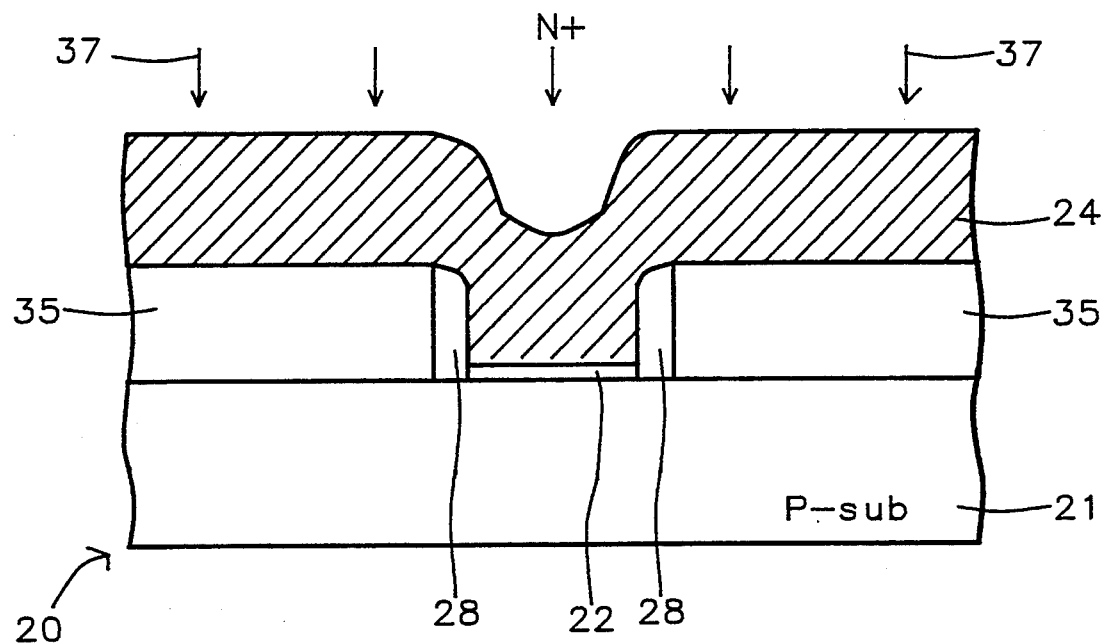

Then, referring to FIG. 3F, the device of FIG. 3E is shown after formation of a blanket (select gate) polysilicon 1 layer 24. Preferably, polysilicon 1 layer 24 is deposited to a preferred range of thicknesses between about 1,000 Å and about 5,000 Å by a conventional LPCVD (low pressure chemical vapor deposition) process.

Subsequently, the polysilicon 1 layer 24 is doped in a blanket application of dopant by ion implantation of N+ dopant ions 37 or diffusion of phosphoryl chloride ($POCl_3$) by a conventional process.

Polysilicon 1 Etch Back or CMP Planarization

1. Etch Back

Figure 3G:
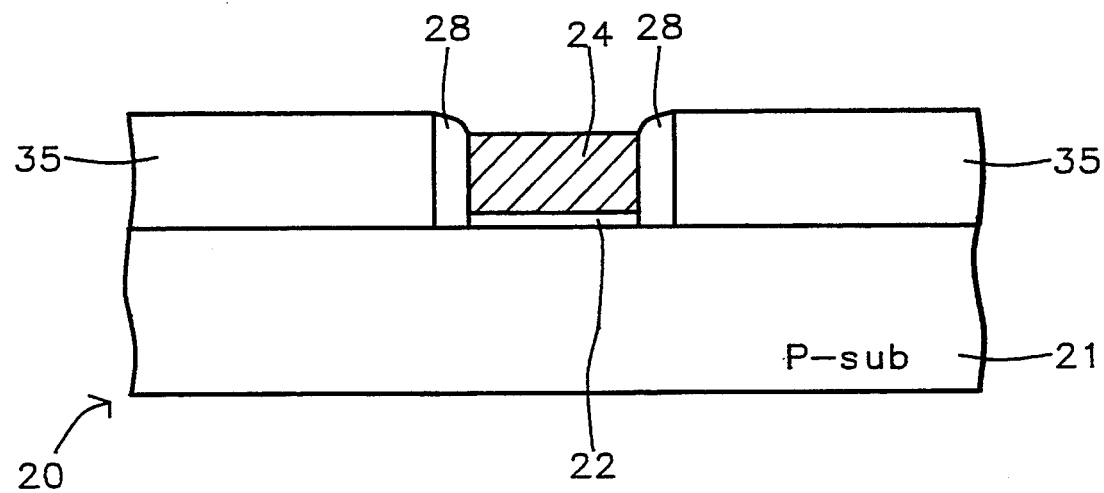

Referring to FIG. 3G, the device of FIG. 3F is shown after the polysilicon 1 layer 24 has planarized by a plasma etch back process or by CMP (chemical-mechanical polishing) removing the portion of layer 24 extending above the top surface of layer 35 so that the layer 24 housed in opening 33" remains and the rest of layer 24 has been removed by etching back or planarization.

Etching of Sacrificial Silicon Nitride Spacers

Figure 3H:
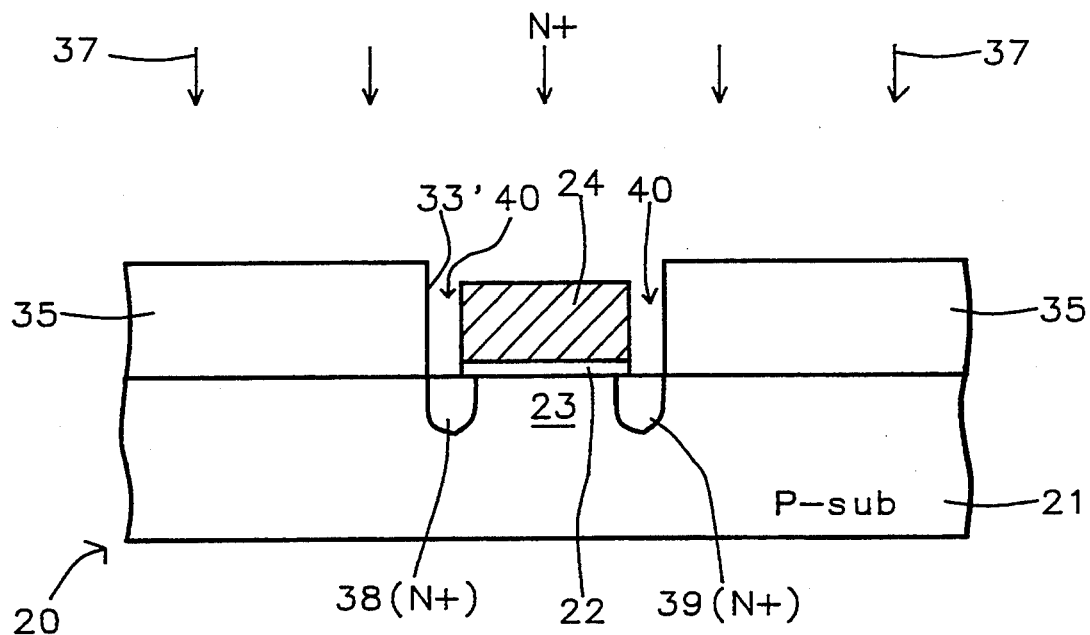

Referring to FIG. 3H, the device of FIG. 3G is shown after the silicon nitride spacers 28 have been etched away, leaving trenches 40 between select gate 24 and first dielectric (silicon dioxide) layer 35 extending all the way down to the P-substrate 21 therebelow which is exposed at the bottom of trenches 40 to facilitate implantation of N+ regions 38 and 39, as described next.

Ion Implantation of Select Gate N+ Regions

Subsequently, as shown by FIG. 3H the substrate 21 is doped through trenches 40 (serving as openings in a mask composed of layer 35 and select gate 24) with dopant ions 37. Doping is performed by ion implantation of arsenic (As) ions 37. The As dopant 37 is applied with a dose within a range between about $1 \text{ E } 13 \text{ cm}^{-2}$ and about $1 \text{ E } 15 \text{ cm}^{-2}$ within a range of energies between about 30 keV and about 100 keV. The doping of ions 37 serves to form N+ regions 38 and 39 on either side of the select channel region 23 which lies beneath the select gate 24. With reference to the mask defining trenches 40, the select gate 24 provides a wall on one side of the trenches 40, and thus it serves as a self-aligned mask for the implantation of N+ ions 37 below the periphery of select gate 24 in substrate 21. The first dielectric (silicon dioxide) layer 35 on the other side of trench 40 provides a confronting wall of trench 40 serving as the other half of the mask for implantation of ions 37.

Etching of First Dielectric Layer

Figure 3I:
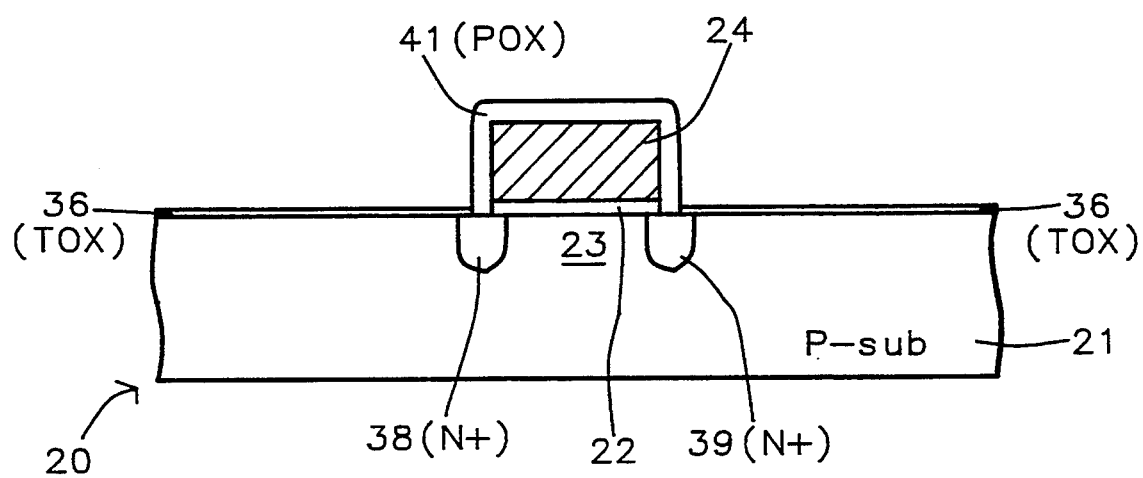

Then, as shown in FIG. 3I, the device of FIG. 3H is shown after the remainder of the first dielectric (silicon dioxide) layer 35 was etched away to expose the surface of P-substrate 21 and those N+ select gate regions 38 and 39 which are not covered by select gate 24. The method of etching comprises use of a wet etchant such as an aqueous HF solution.

Formation of Tunnel Oxide and SiO2 Dielectric Layers

Referring again to FIG. 3I, the device is shown after a silicon dioxide layer 36 has been formed on the exposed surfaces of the device 20. Those "exposed" surfaces include the surfaces of substrate 21, which include the surfaces of N+ regions 38 and 39 upon which are deposited one of the silicon dioxide layers comprising a tunnel oxide layer 36 with a thickness of about 100 Å within a thickness range between about 50 Å and about 120 Å. In addition, a polysilicon oxide layer 41 is formed over polysilicon 1 select gate 24 with a thickness range between about 200 Å and about 400 Å. Layer 41 is formed over all of the exposed surfaces of the select gate 24 (other than the surface bonded to gate oxide layer 22), reaching down into contact with N+ regions 38 and 39. A single oxidation step is used to produce tunnel oxide layer 36 and polysilicon oxide layer 41, since over the doped polysilicon, the oxidation rate is faster. Therefore, the thickness of layer 41 is greater than that of layer 36. The tunnel oxide layer 36 and the polysilicon oxide 41 are formed by an oxidation process at a temperature between about 800° C. and about 900° C.

Polysilicon 2 Layer Floating Gate Formation

Figure 3J:
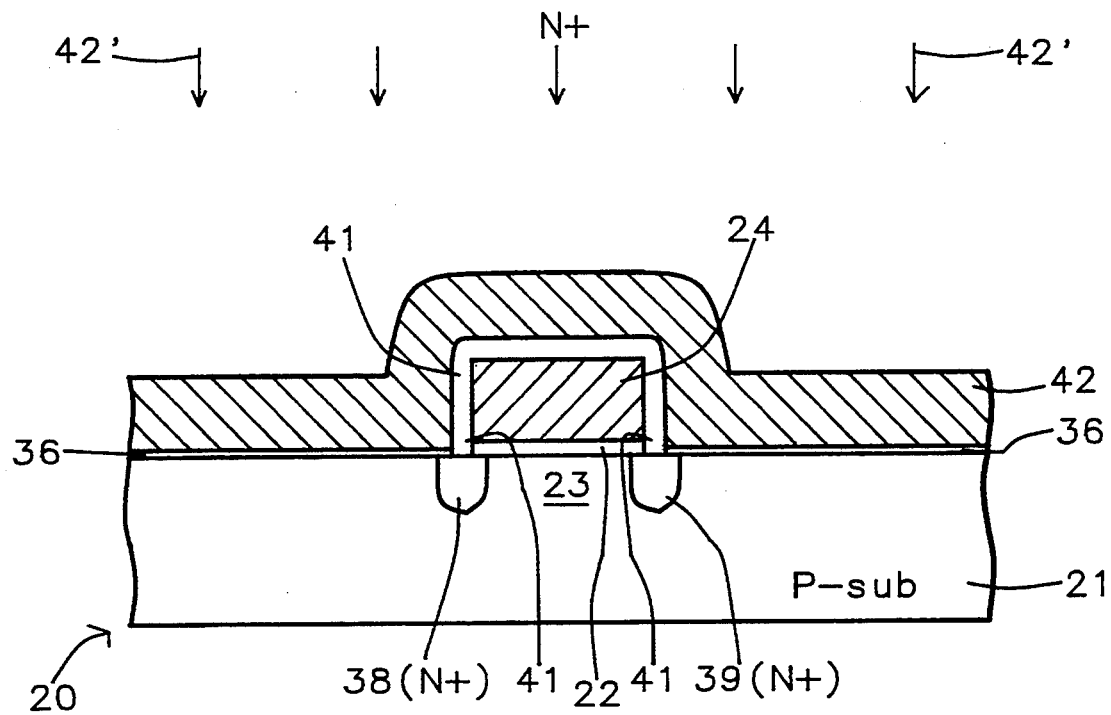

Then, referring to FIG. 3J, a blanket floating gate layer 42 composed of polysilicon 2 is deposited to a preferred range of thicknesses between about 500 Å and about 2,000 Å by the conventional LPCVD (low pressure chemical vapor deposition) process.

Subsequently, the polysilicon 2 layer 42 is doped in a blanket application of dopant 42' in a conventional manner.

Interpolysilicon Dielectric

Figure 3K:
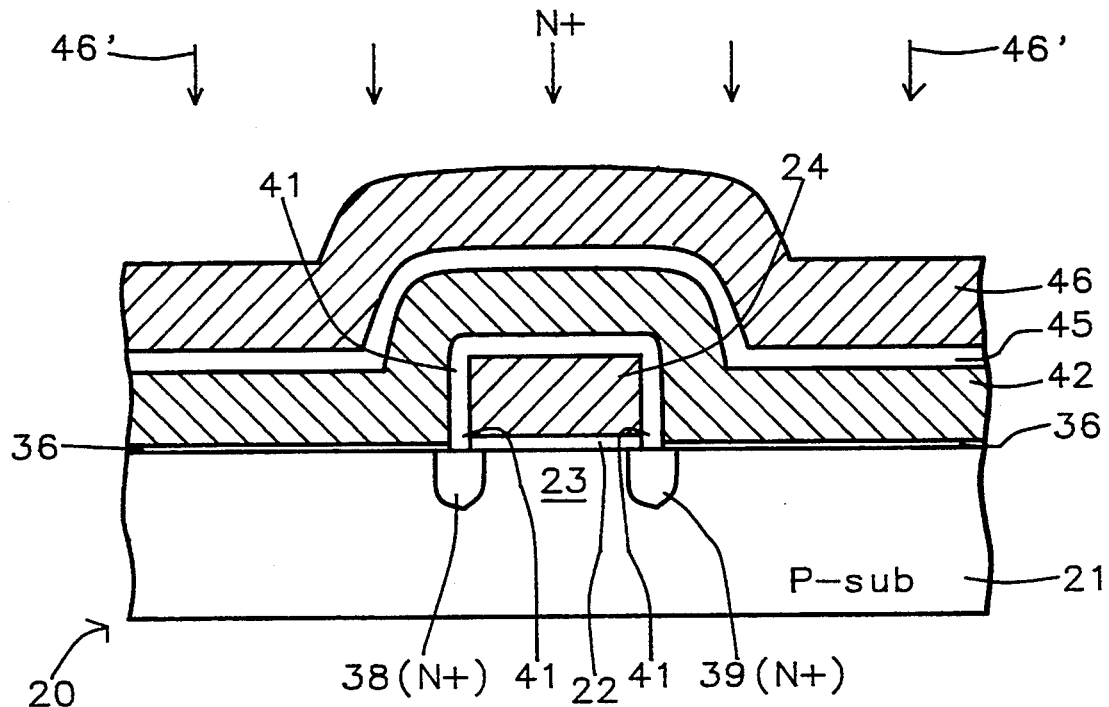

Referring to FIG. 3K, the product of FIG. 3J is shown after the formation of a conventional dielectric interpolysilicon sandwich in the form of a thin film 45 e.g. ONO (Silicon oxide/silicon nitride/silicon oxide) having a thickness between about 150 Å and about 300 Å formed by a well known process.

Control Gate Deposition and Doping

Then, referring again to FIG. 3K, a blanket deposit of control gate layer 46 composed of polysilicon 3 was deposited to a preferred range of thicknesses between about 1,000 Å and about 4,000 Å by the conventional LPCVD (low pressure chemical vapor deposition) process.

Subsequently, the polysilicon 3 layer 46 was doped in a blanket application of dopant 46' in a conventional process.

Stacked Gate Masking and Etching

Figure 3L:
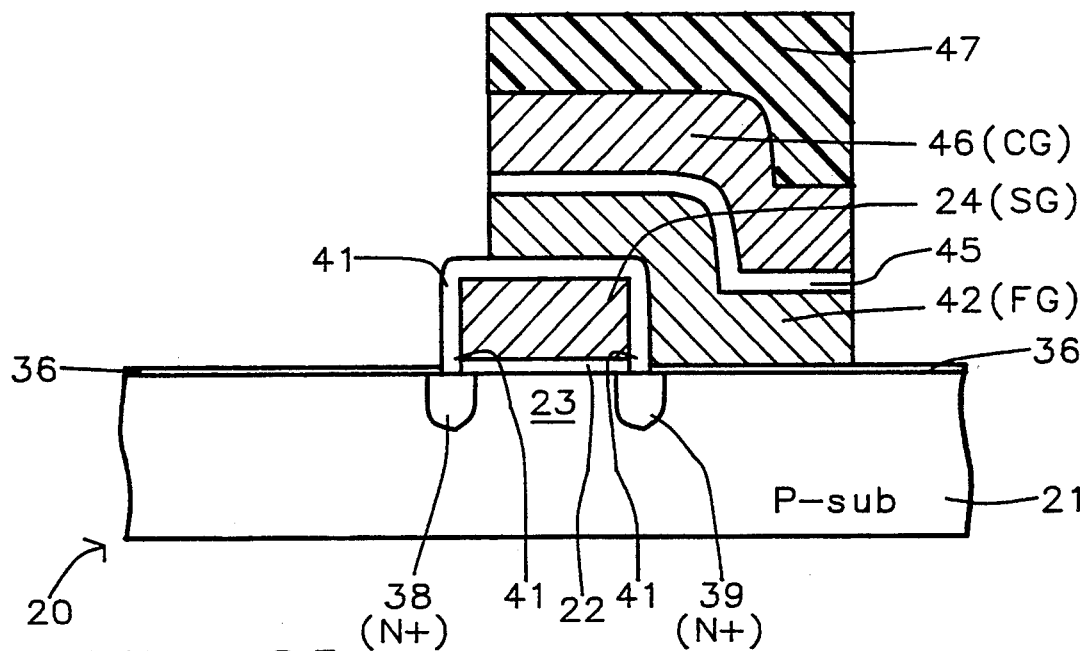

Referring to FIG. 3L, the device 20 of FIG. 3K has formed thereon a photoresist mask 47 over the polysilicon 2 layer 46. Mask 47 is patterned in the desired pattern to form the floating gate 42, ONO layer 45, and control gate 46 in the conventional manner.

Then the polysilicon 3 layer 46, ONO layer 45 and floating gate layer 42 are etched through the openings in mask 47.

In particular polysilicon 3 layer 46 is etched preferably using $F_2$ or $Cl_2$ gas based plasma etching using the pattern in the mask 47 to pattern the polysilicon 3 layer 46 to form control gate 46 therefrom.

Then the ONO layer 45 is etched preferably using $F_2$ or $Cl_2$ based etchant of ONO patterning ONO layer 45 with the pattern in the mask 47.

Finally, polysilicon 2 layer 42 is etched using the same mask 47, preferably using $F_2$ or $Cl_2$ based etchant of polysilicon patterning layer 42 in accordance with the pattern in the mask 47 to form floating gate 42 in the same pattern as ONO layer 45 and control gate 46.

Figure 3M:
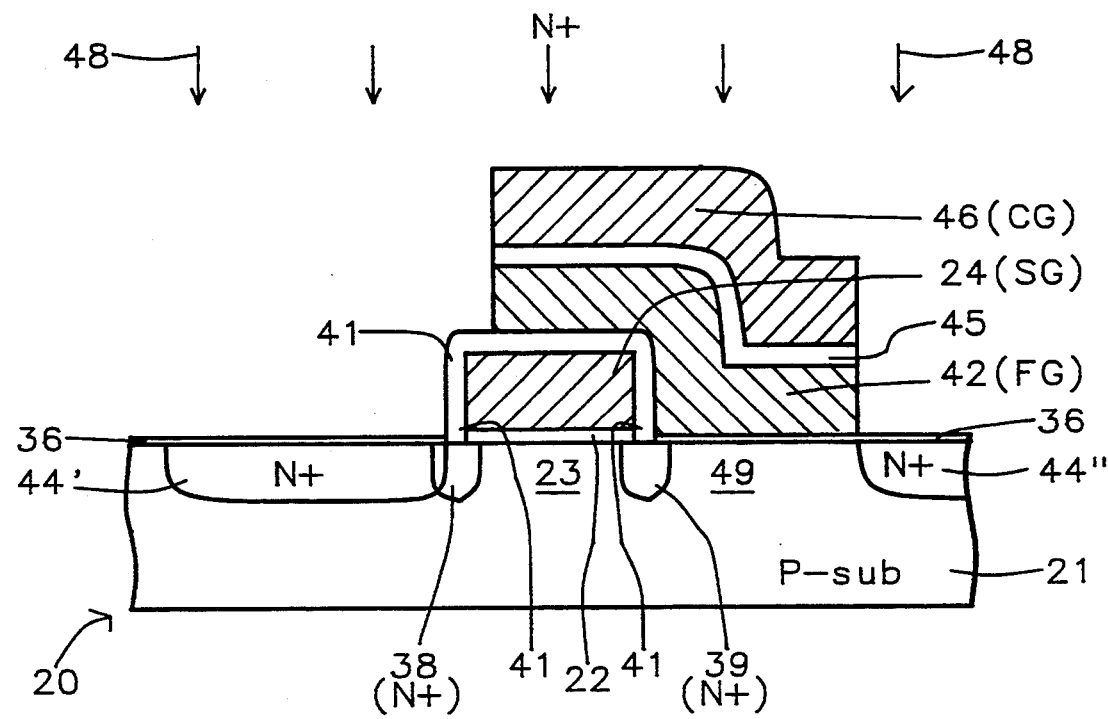
Figure 3N:
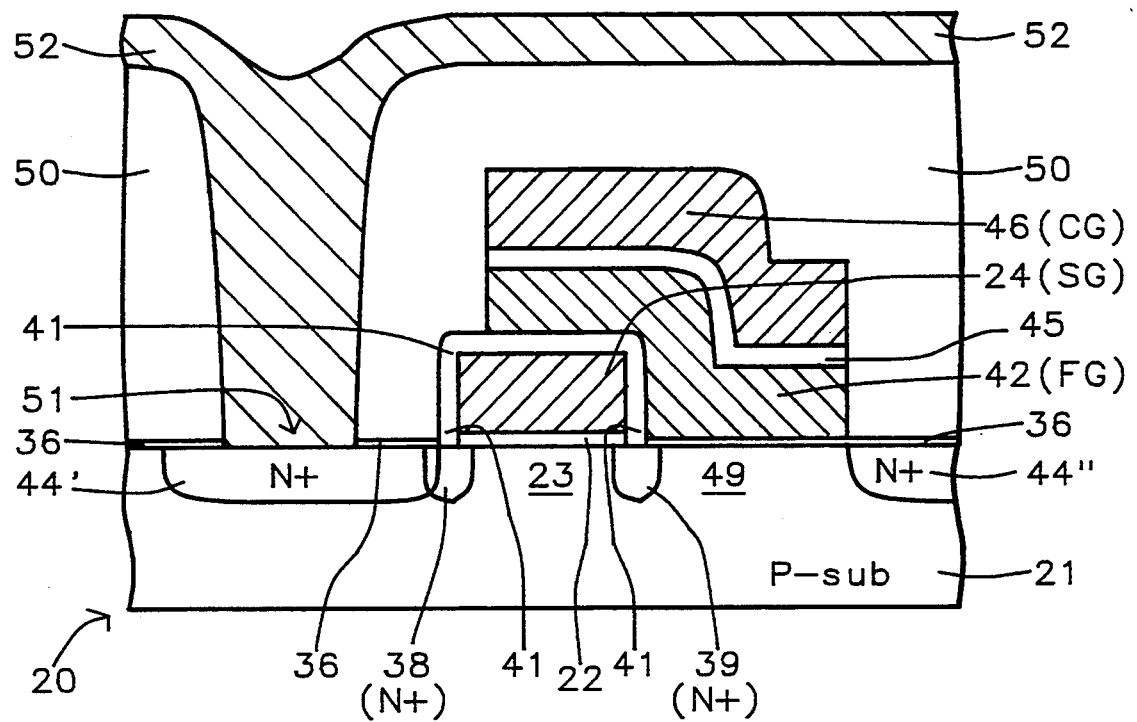

Next mask 47 is stripped from the device 20, as shown in FIG. 3M.

N+ Source/Drain Ion Implant

Referring to FIG. 3M, the product of FIG. 3L is shown after ion implantation into N+ regions 44' and 44" of the stacked gate N+ S/D (source/drain.) The arsenic (As) dopant 48 is implanted to provide S/D regions for the floating gate portion of the device. Below the exposed surfaces of the tunnel oxide layer 36 S/D N+ regions 44' and 44" are formed in the P-substrate 21 on either side of the control gate 46 and floating gate 42 which along with polysilicon oxide layer 41 and select gate 24 provide self-aligned masking to prevent ion implantation below the gate electrodes 24, 42 and 46. The implantation of As ions 48 is performed with a dose within a range between about $1\ E\ 15\ cm^{-2}$ and about $5\ E\ 15\ cm^{-2}$ within a range of energies between about 30 keV and about 80 keV.

Back End Process

Referring to FIG. 3N, the product of FIG. 3M is shown following additional back end processing steps. The conventional back end process steps include deposition of a glass (BPSG) layer 50 by a conventional process. Then the BPSG glass layer is heated in a conventional manner to cause it to flow in a conventional manner.

A bit line contact opening 51 was formed through BPSG layer 50 extending through the tunnel oxide layer 36 to N+ region 44'.

By a conventional process bit line metallization 52 is formed on device 20 extending across the upper surface of the device 20 above the BPSG layer 50, and the bit line metallization 52 reaches down though contact opening 51 into contact with N+ drain region 44'.

Finally, conventional passivation processing steps are performed.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabricating an EEPROM on a lightly doped semiconductor substrate comprising,
    forming a first dielectric layer on said substrate,
    patterning said first dielectric layer with a select gate channel opening therein,
    forming sacrificial spacer structures adjacent to the edges of said channel opening in said first dielectric layer so that said substrate is exposed between said sacrificial spacer structures,
    forming a gate oxide on the exposed substrate of said channel opening,
    forming a select gate for a select transistor over said gate oxide between said spacer structures in said channel opening,
    removing said sacrificial spacer structures exposing the surface of said substrate thereby forming trenches between said first dielectric layer and said select gate,
    ion implanting source/drain regions for said select transistor in said substrate to define the select transistor channel using said select gate and said first dielectric layer as a mask,
    removing said first dielectric layer exposing the surface of said substrate surrounding said select gate,
    forming a silicon dioxide layer over said select gate and said substrate,
    forming a floating gate over said silicon dioxide layer so that said floating gate is over a portion of said select gate and over a portion of said substrate,
    forming an interconductor dielectric layer over said floating gate,
    forming a control gate over said interconductor dielectric layer so that a stacked gate is formed from said floating gate, said interconductor dielectric layer and said control gate, and
    ion implanting source/drain regions for said stacked gate in said substrate using said stacked gate and said silicon dioxide layer over said select gate as a mask.

2. A method in accordance with claim 1 wherein said first dielectric layer comprises silicon dioxide having a thickness within a range between about 1,000 Å and about 4,000 Å.

3. A method in accordance with claim 2 wherein said interconductor dielectric layer comprises ONO.

4. A method in accordance with claim 3 wherein said select gate, floating gate and control gate comprise polysilicon.

5. A method in accordance with claim 1 wherein said sacrificial spacer structures are formed from a silicon nitride layer having a thickness of about 1000 Å by an etch back process.

6. A method in accordance with claim 1 wherein said gate oxide has a thickness of about 200 Å.

7. A method in accordance with claim 1 wherein said silicon dioxide layer over said select gate comprises polysilicon oxide and said silicon dioxide layer over said substrate comprises a tunnel oxide.

8. A method in accordance with claim 1 wherein said dielectric layer comprises silicon dioxide.

9. A method in accordance with claim 1 wherein said source/drain regions for said select transistor are formed by implantation of arsenic ions at an energy between about 30 keV and about 100 keV and a dose between about $1 \text{ E } 13 \text{ cm}^{-2}$ and about $1 \text{ E } 15 \text{ cm}^{-2}$.

10. A method in accordance with claim 1 wherein said source/drain regions for said stacked gate are formed by implantation of arsenic ions at an energy between about 30 keV and about 80 keV and a dose between about $1 \text{ E } 15 \text{ cm}^{-2}$ and about $5 \text{ E } 15 \text{ cm}^{-2}$.

11. A method in accordance with claim 10 wherein said source/drain regions for said select transistor are formed by implantation of arsenic ions at an energy between about 30 keV and about 100 keV and a dose between about $1 \text{ E } 13 \text{ cm}^{-2}$ and about $1 \text{ E } 15 \text{ cm}^{-2}$.

12. A method of fabricating an EEPROM on a lightly doped semiconductor substrate comprising,
    forming a sacrificial silicon dioxide layer on said substrate,
    patterning said sacrificial silicon dioxide layer with a mask with a select gate channel opening therein and then etching said sacrificial silicon dioxide layer to form a select gate channel opening in said sacrificial silicon dioxide layer,
    forming sacrificial spacer structures adjacent to the edges of said channel opening in said sacrificial silicon dioxide layer so that said substrate is exposed between said sacrificial spacer structures,
    forming a gate oxide on the exposed substrate of said channel opening,
    forming a select gate for a select transistor over said gate oxide between said spacer structures in said channel opening,
    removing said sacrificial spacer structures exposing the surface of said substrate thereby forming trenches between said sacrificial silicon dioxide layer and said select gate,
    ion implanting source/drain regions for said select transistor in said substrate to define the select transistor channel using said select gate and said sacrificial silicon dioxide layer as a mask,
    removing said sacrificial silicon dioxide layer exposing the surface of said substrate surrounding said select gate,
    forming a silicon dioxide layer over said select gate and said substrate,
    forming a floating gate over said silicon dioxide layer so that said floating gate is over a portion of said select gate and over a portion of said substrate,
    forming an interconductor dielectric layer over said floating gate,
    forming a control gate over said interconductor dielectric layer so that a stacked gate is formed from said floating gate, said interconductor dielectric layer and said control gate, and
    ion implanting source/drain regions for said stacked gate in said substrate using said stacked gate and said silicon dioxide layer over said select gate as a mask.

13. A method in accordance with claim 12 wherein said sacrificial silicon dioxide layer has a thickness within a range between about 1,000 Å and about 4,000 Å.

14. A method in accordance with claim 13 wherein said interconductor dielectric layer comprises ONO.

15. A method in accordance with claim 14 wherein said select gate, floating gate and control gate comprise polysilicon.

16. A method in accordance with claim 12 wherein said sacrificial spacer structures are formed from a silicon nitride layer having a thickness of about 1000 Å by an etch back process.

17. A method in accordance with claim 12 wherein said gate oxide has a thickness of about 200 Å.

18. A method in accordance with claim 12 wherein said silicon dioxide layer over said select gate comprises polysilicon oxide and said silicon dioxide layer over said substrate comprises a tunnel oxide.

19. A method in accordance with claim 12 wherein said source/drain regions for said select transistor are formed by implantation of arsenic ions at an energy between about 30 keV and about 100 keV and a dose between about $1 \text{ E } 13 \text{ cm}^{-2}$ and about $1 \text{ E } 15 \text{ cm}^{-2}$.

20. A method in accordance with claim 12 wherein said source/drain regions for said stacked gate are formed by implantation of arsenic ions at an energy between about 30 keV and about 80 keV and a dose between about $1 \text{ E } 15 \text{ cm}^{-2}$ and about $5 \text{ E } 15 \text{ cm}^{-2}$.

* * * * *